United States Patent [19]

Ashida et al.

[11] 3,858,129

[45] Dec. 31, 1974

[54] TUNING ARRANGEMENT HAVING COAXIALLY MOUNTED SHAFTS AND REMOVABLE KNOBS

[75] Inventors: Takashi Ashida, Akashi; Nobuo Yamada, Kobe, both of Japan

[73] Assignees: Fujitsu Limited, Kawasaki; Fujitsu Ten Limited, Kobe, both of, Japan; part interest to each

[22] Filed: May 25, 1973

[21] Appl. No.: 364,052

Related U.S. Application Data

[63] Continuation of Ser. No. 211,498, Dec. 23, 1971.

[30] Foreign Application Priority Data

Dec. 28, 1970 Japan ............................ 45-127989

[52] U.S. Cl. .................. 334/78, 74/10.45, 317/253, 317/256, 334/81

[51] Int. Cl. ............................................ H03j 3/20

[58] Field of Search ............... 334/7, 65, 78, 79, 81, 334/84; 74/10.45; 317/249 R, 249 D, 251, 253, 256

[56] References Cited

UNITED STATES PATENTS

| | | | |
|---|---|---|---|
| 2,853,882 | 9/1958 | Mason | 334/84 X |
| 3,621,722 | 11/1971 | Newberry | 74/10.45 X |
| 3,697,904 | 10/1972 | Mohri et al. | 334/78 X |
| 3,737,817 | 6/1973 | Ashida et al. | 334/7 |

*Primary Examiner*—Paul L. Gensler
*Attorney, Agent, or Firm*—Herbert L. Lerner

[57] ABSTRACT

A tuning shaft is rotatably mounted in electrical apparatus and has a rear end affixed to the tuning means of the electrical apparatus. An adjusting shaft is rotatably mounted coaxially with and around the tuning shaft. The adjusting shaft has a rear end affixed to the variable condenser of the electrical apparatus. The tuning shaft and the adjusting shaft are rotatable independently of each other.

4 Claims, 6 Drawing Figures

PATENTED DEC 3 1 1974

3,858,129

SHEET 1 OF 2

TUNING ARRANGEMENT HAVING COAXIALLY MOUNTED SHAFTS AND REMOVABLE KNOBS

This is a continuation, of application Ser. No. 211,498, filed Dec. 23, 1971.

The present invention relates to a tuning arrangement for electrical apparatus. More particularly, the invention relates to a tuning arrangement for an automobile radio.

In the tuning arrangement of the invention, the variable condenser of an automobile radio may be adjusted after the radio has been installed in the automobile. The turning arrangement of the invention facilitates such adjustment.

Generally, the input circuit of an automobile radio receiver includes a variable condenser for fine tuning. This condenser is generally referred to as the timer condenser. The variable condenser is adjusted in order to provide for the dispersion of the antenna capacity, and to establish matching between the automobile antenna and the input circuit of the receiver. Usually, the variable condenser is provided in an arbitrary space, rather than in a specifically allocated space. Therefore, in an automobile radio receiver, in which space is at a premium, it has been extremely difficult to adjust the variable condenser after the radio is installed in the car.

The principal object of the invention is to provide a new and improved tuning arrangement for electrical apparatus which permits adjustment of the variable condenser of the electrical apparatus with facility after the electrical apparatus is installed.

An object of the invention is to provide a tuning arrangement for an automobile radio which permits adjustment of the variable condenser of the radio with facility after the radio has been installed in the automobile.

Another object of the invention is to provide a tuning arrangement for electrical apparatus which is of simple but sturdy structure and functions with efficiency, effectiveness and reliability.

Still another object of the present invention is to provide a tuning arrangement for an automobile radio which permits adjustment of the variable condenser of the radio from the front of the tuner frame.

In accordance with the invention, electrical apparatus having a variable condenser and tuning means comprises a tuning shaft rotatably mounted and having a front end and having a rear end affixed to the tuning means. An adjusting shaft is rotatably mounted coaxially with the tuning shaft and has a front end and a rear end affixed to the condenser. The tuning shaft and the adjusting saft are rotatable independently of each other.

The adjusting shaft is positioned around the tuning shaft. The tuning shaft passes freely through the condenser. The tuning means rotates with the tuning shaft and the condenser rotates with the adjusting shaft.

A removably mountable tuning know having stop means is removably mounted on the front end of the tuning shaft and a removably mountable adjusting knob having stop means is removably mounted on the front end of the adjusting shaft.

An adjusting member is removably mounted on the front end of the adjusting shaft and an adjusting knob is removably mounted on the adjusting member. The adjusting member and the adjusting knob rotate with the adjusting shaft.

In order that the invention may be readily carried into effect, it will now be described with reference to the accompanying drawings, wherein FIG. 1 is a circuit diagram of the input circuit of an automobile radio receiver;

In the FIGS., the same components are identified by the same reference numerals.

Figure 1:
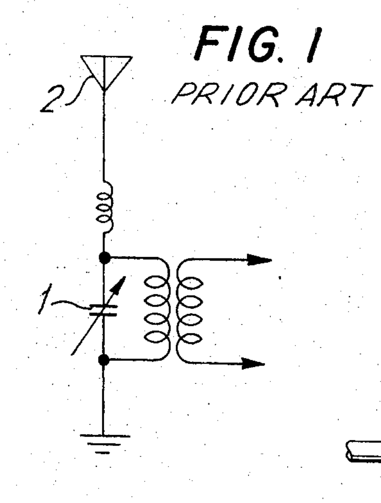

In the input circuit of an automobile radio receiver, as shown in FIG. 1, a variable condenser 1 is electrically coupled to an antenna 2.

Figure 2:
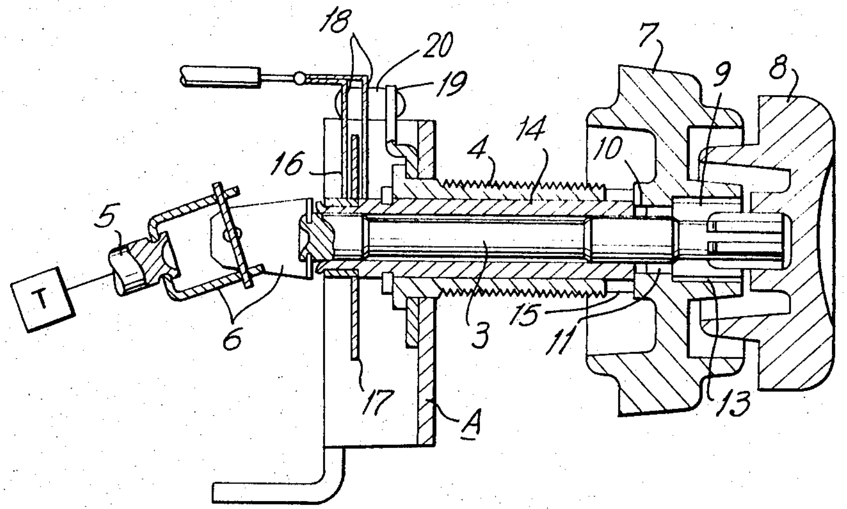
FIG. 2 is a vertical sectional view of part of the manual tuning mechanism of an automobile radio and an embodiment of the tuning arrangement of the invention.

In the embodiment of FIG. 2, of the tuning arrangement of the invention, a tuning shaft 3 is rotatably supported by a bearing 4. The tuning shaft 3 has a rear end which is coupled to a tuning means, for example, a tuner, shown schematically at T in FIG. 2 via a universal joint 6, a transmission shaft 5 and a clutch (not shown in the FIGS.) which are rotatable relative to each other. The tuning shaft 3 has a front end on which an adjusting knob 7 and a turning knob 8 is removably mounted.

In FIG. 2, the adjusting knob 7 is not engaged to the front end of an adjusting shaft 14. The adjusting shaft 14 is coaxially positioned around the tuning shaft 3. The adjusting shaft 14 has an axial bore formed therein having a diameter which is greater than the diameter of the tuning shaft 3. A key 12 (FIG. 3) is engaged in a channel 11 which extends in the axial direction on the circumference of a collar 10 of the tuning shaft 3. The key 12 is provided on the internal surface of the adjusting knob 7 in the rear portion of the bore 9.

An engaging part 13, hereinafter described, is formed on the internal surface of the adjusting knob 7 at the front portion of the bore 9. The engaging part 13 engages the front portion of the tuning shaft 3. The tuning knob 8 covers the bore 9 of the adjusting knob 7.

A variable condenser 16 is affixed to the rear end of the adjusting shaft 14. The variable condenser 16 is coaxially positioned around the tuning shaft 3 and around the adjusting shaft 14 to which it is affixed. A channel 15 is formed in the adjusting shaft 14 at the front end thereof. The engaging part 13 of the adjusting knob 7 engages the channel 15 of the adjusting shaft 14 during the manual adjustment of the variable condenser 16. The variable condenser 16 has a rotor 17 which is the part of said condenser affixed to the adjusting shaft 14. The tuning shaft 3 extends through the rotor 17 of the variable condenser 16 in an independent relation therewith, so that rotation of said tuning shaft does not rotate said rotor. The rotor 17 is affixed to the rear end of the adjusting shaft 14, so that said rotor rotates with said adjusting shaft. The variable condenser 16 further comprises a stator 18 which is affixed to a frame fitting component 19 by fittings 20. The fitting component 19 is positioned between a front panel A of the frame of the tuning mechanism and the bearing 4 and is affixed to said frame.

The rear end of the tuning shaft 3 extends freely through the variable condenser 16. Although the adjusting shaft 14 of the variable condenser 16 coaxially surrounds the tuning shaft 3, said adjusting shaft and said tuning shaft rotate independently of each other. The variable condenser 16 is affixed to the rear end of, and rotates with, the adjustable shaft 14, as hereinbefore described.

The variable condenser 16 is adjusted in the automobile radio as follows. The adjusting knob 7 and the tuning knob 8 are removed from the adjusting shaft 14 and from the tuning shaft 3. The adjusting knob 7 is then inserted in reverse, that is, with the front portion having the engaging part 13 facing the tuning shaft 3. The adjusting knob 7 is then pushed inward, so that the engaging part or stop 13 is inserted into the channel 15 of the adjusting shaft 14. The variable condenser 16 may then be freely adjusted by rotating the adjusting shaft 14. This condition is illustrated in FIG. 3.

Figure 3:
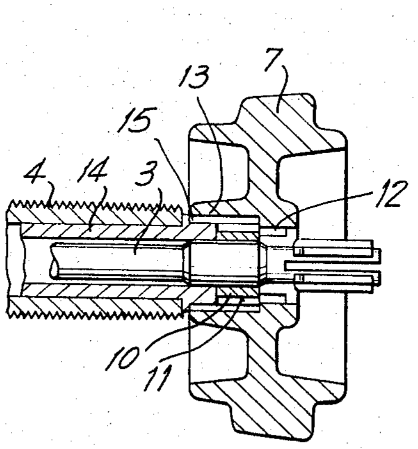
FIG. 3 is a vertical sectional view of part of the tuning arrangement of the invention illustrating the affixing of the adjusting knob to the adjusting shaft in an arrangement which permits the adjustment of a variable condenser.

As illustrated in FIG. 3, the tuning knob 8 is not necessary in adjusting the variable condenser 16. After the completion of the fine tuning of the variable condenser 16, the adjusting knob 7 is removed from the adjusting shaft 14 and is again inserted on the front end of the tuning shaft 3, together with the tuning knob 8, in the relation shown in FIG. 2. The tuning arrangement is then returned to the condition in which manual tuning is feasible.

Figure 4:
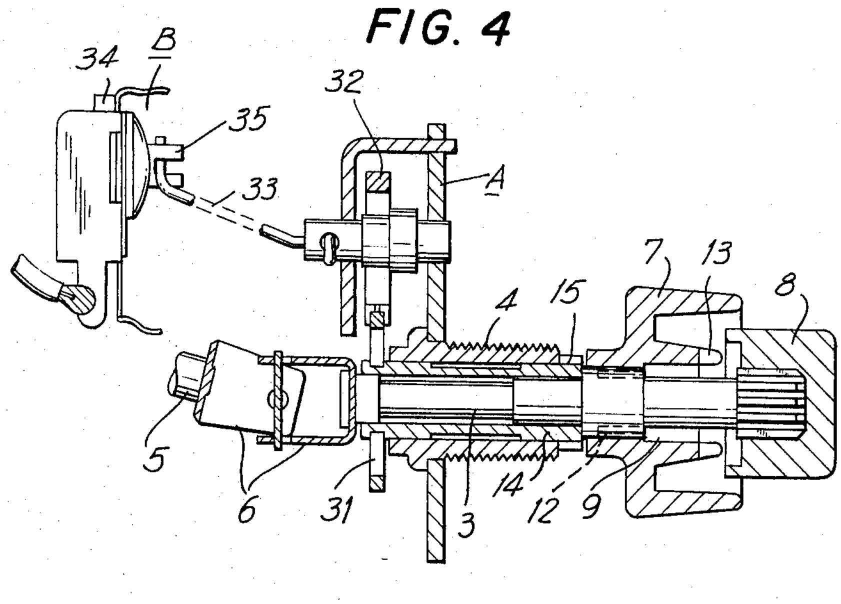
FIG. 4 is a vertical sectional view of part of the manual tuning mechanism of an automobile radio and another embodiment of the tuning arrangement of the invention.
Figure 5:
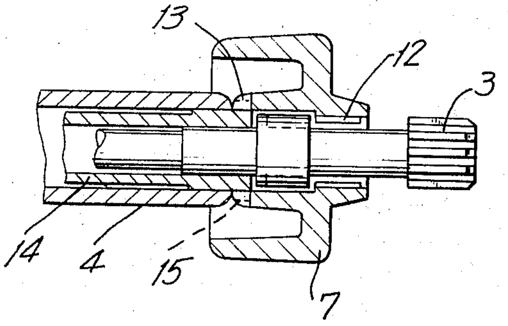
FIG. 5 is a vertical sectional view of part of the tuning arrangement of the invention illustrating the affixing of the adjusting knob to the adjusting shaft in the embodiment of FIG. 4.

The coupling relation between the variable condenser 16 and the adjusting shaft 14 need not be a direct coupling, as shown in the embodiment of FIGS. 2 and 3. The variable condenser 16 may be coupled to the adjusting shaft 14 via a transmission coupling arrangement, as shown in the embodiment of FIGS. 4 and 5. In FIG. 4, the tuning shaft 3 and the adjusting shaft 14 are constructed in the same manner as in the embodiments of FIGS. 2 and 3. Although the shape of the various components, including the tuning shaft 3, the bearing 4, the universal joint 6, the adjusting knob 7 and the tuning knob 8, for example, may differ from their shapes in the embodiments of FIGS. 2 and 3, they function in the same manner as the similar components of FIGS. 2 and 3.

In the embodiment of FIG. 4, a gear 31 is coaxially mounted on and affixed to the rear end of the adjusting shaft 14. The gear 31 rotates with the adjusting shaft 14 and engages a gear 32 which is rotatably mounted on the tuner frame A. A connecting rod 33 is affixed to the hub of the gear 32. The end of the connecting rod 33 farthest from the gear 32 is coupled to an adjusting screw 35 of a variable condenser 34. The variable condenser or trimmer condenser 34 is mounted on a tuner frame B. The adjusting screw 35 of the variable condenser 34 is rotatable with rotation of the adjusting shaft 14 through the coupling linkage of the gears 31 and 32 and the connecting rod 33.

In adjusting the variable condenser 34 of the embodiment of FIG. 4, the adjusting knob 7 and the tuning knob 8 are removed. The adjusting knob 7 is then inserted in a reverse manner onto the adjusting shaft 14, as shown in FIG. 5, so that the variable condenser 34 is freely manually adjustable by rotation of said adjusting knob. In each of the aforedescribed embodiments, the adjustment of the variable condenser is not limited to the insertion of the adjusting knob 7 in a reverse manner and its engagement with the adjusting shaft 14. It is also possible to adjust the variable condenser by utilizing a volume control or tone control knob. Of course, in this case, the knobs for volume control and tone control must be utilized. The front end of the adjusting shaft 14 must first be formed in a size and shape which permit the volume control and tone control knobs to be inserted thereon.

Figure 6:
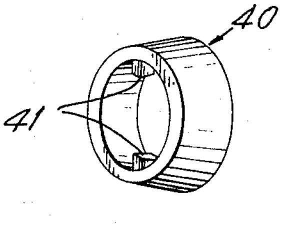
FIG. 6 is a perspective view of an adjusting member for positioning the adjusting shaft.

Furthermore, it is also possible to adjust the variable condenser by utilizing an adjusting member having a pawl which engages with the channel of the adjusting shaft 14 and which may be stored in a bore formed in the knob when not being utilized. FIG. 6 illustrates an adjusting member 40 having protrusions 41 formed on its internal surface. The adjusting member 40 is utilized to freely adjust the variable condenser via the adjusting shaft 14.

It is clear from the foregoing description that the variable condenser may be adjusted with facility from the front side of the tuner frame in coaxial relation with the tuning shaft 3 in an automobile radio. There is no restriction due to the type of automobile in which the radio is inserted, nor is there any restriction due to the structure of the fitting. The tuning arrangement of the invention is very effective in tuning the variable condenser of an automobile radio.

The tuning arrangement of the invention may be applied to a pushbutton type automobile radio or to any type of automobile radio, or other electrical apparatus. The tuning arrangement of the invention may thus be utilized for manual tuning type and automatic tuning type automobile radios. The tuning arrangement of the invention may also be utilized with television equipment and other electrical apparatus.

While the invention has been described by means of specific examples and in specific embodiments, it should not be limited thereto, for obvious modifications will occur to those skilled in the art without departing from the spirit and scope of the invention.

We claim:

1. Electrical apparatus having an input circuit having a variable condenser and a tuning means, for tuning a tuned electrical circuit, said electrical apparatus comprising, tuning shaft rotatably mounted and having a front end and having a rear end affixed to the tuning means, the tuning shaft passing freely through the condenser; and an adjusting shaft rotatably mounted coaxially with and around the tuning shaft and having a front end and having a rear affixed to the condenser, the tuning shaft and the adjusting shaft being rotatable independently of each other, the tuning means being adjustable by the tuning shaft and the condenser being rotatable with the adjusting shaft, and a knob removably mounted adjacent the front end of said tuning shaft for rotating said tuning shaft, said adjusting shaft being hidden by said knob in the condition of non-engagement with said knob during normal operation.

2. Electrical apparatus as claimed in claim 1, wherein said knob has a front inner surface and a rear inner surface, and two engaging means for engaging the tuning shaft and the adjusting shaft, respectively, with the front inner surface and the rear inner surface of the bore.

3. Electrical apparatus as claimed in claim 1, wherein said knob has a bore, and an adjusting member in the bore of the knob for adjusting the adjusting shaft.

4. Device for adjusting a condenser means in an electrical apparatus of the type having a control knob for controlling an operating aspect of said electrical apparatus during normal operation comprising a rotatably mounted control shaft for controlling said operating aspect of said electrical apparatus, said control shaft having a front end, said control knob being mounted on the front end of said control shaft, an adjusting shaft rotatably mounted coaxially around said control shaft and having a front end and a rear end, said control shaft and said adjusting shaft being rotatable independently of each other, means connecting said rear end of said adjusting shaft to said condenser means, and an adjusting knob mounted on the front end of said adjusting shaft for adjusting said condenser means, said adjusting knob having a front inner surface and a rear inner surface, said adjusting knob being reversibly mounted on said adjusting shaft so that in one mounted position of said adjusting knob, said inner surface of said adjusting knob engages said adjusting shaft to provide simultaneous position of said adjusting shaft and in the other mounting position of said adjusting knob, said adjusting knob is rotatable independently of said adjusting knob.

* * * * *